United States Patent
Schultz et al.

(10) Patent No.: US 6,301,636 B1
(45) Date of Patent: *Oct. 9, 2001

(54) CONTENT ADDRESSABLE MEMORY SYSTEM WITH CASCADED MEMORIES AND SELF TIMED SIGNALS

(75) Inventors: Kenneth James Schultz, Kanata; Farhad Shafai; Garnet Frederick Randall Gibson, both of Nepean, all of (CA)

(73) Assignee: Nortel Networks Limited, Montreal (CA)

(*) Notice: Subject to any disclaimer, the term of this patent is extended or adjusted under 35 U.S.C. 154(b) by 0 days.

This patent is subject to a terminal disclaimer.

(21) Appl. No.: 09/572,861

(22) Filed: May 18, 2000

Related U.S. Application Data

(63) Continuation of application No. 08/919,227, filed on Aug. 28, 1997, now Pat. No. 6,230,236.

(51) Int. Cl.[7] ............................. G06F 13/00; G11C 15/00
(52) U.S. Cl. ................... 711/108; 365/49; 711/5; 711/167
(58) Field of Search ................. 711/5, 108, 167; 365/49, 210, 230.03, 230.06, 233; 713/500

(56) References Cited

U.S. PATENT DOCUMENTS

| | | | |
|---|---|---|---|
| 4,670,858 | * 6/1987 | Almy | 365/49 |
| 5,018,111 | * 5/1991 | Madland | 365/233 |
| 5,031,141 | * 7/1991 | Guddat | 365/49 |
| 5,034,919 | * 7/1991 | Sasai et al. | 365/49 |
| 5,289,403 | * 2/1994 | Yetter | 365/49 |
| 5,517,441 | * 5/1996 | Dietz et al. | 365/49 |
| 5,555,397 | * 9/1996 | Sasama et al. | 711/108 |
| 5,568,416 | * 10/1996 | Kawana et al. | 365/49 |
| 5,828,593 | * 10/1998 | Schultz et al. | 365/49 |
| 5,859,791 | * 1/1999 | Schultz et al. | 365/49 |
| 6,022,707 | * 9/2000 | Schultz et al. | 711/108 |

OTHER PUBLICATIONS

K.J. Schultz et al, "Architectures for Large Capacity CAMs," Integration: the VLSI Journal, vol. 18, 1995, pp. 151–171.*

Moors et al, "Cascading Content Addressable Memories," IEEE Micro, vol. 12, No. 3, Jun. 1, 1997, pp. 56–66.*

"Self–Timed Hit Circuit for A Content Addressable Memory," IBM Tech. Disc. Bull., vol. 38, No. 2, Feb. 1, 1995, pp. 65–66.*

Yamagata et al, "A 288–kb Fully Parallel Content Addressable Memory Using A Stacked Capacitor Cell Structure," IEEE Journal of Solid State Circuits, vol. 27, No. 12, Dec. 1, 1992, pp. 1927–1933.*

* cited by examiner

*Primary Examiner*—Glenn Gossage
(74) *Attorney, Agent, or Firm*—Dennis R. Haszko

(57) ABSTRACT

A system includes cascaded content addressable memory (CAM) chips connected to a common bus. Each CAM chip includes a CAM array, a self-timed signal generator and hit propagation and match address transfer circuits. Each CAM array including an array of core cells provides, through its encoder, hit and match address signals resulting from a search operation in response to a clock signal. Each match address transfer circuit transfers the match address signal to the common bus, in response to a self-timed signal, the hit signal and a propagation-in hit signal provided from an upstream CAM chip, so that more than one CAM chip is prevented from providing the match address signal to the common bus simultaneously. Each hit propagation circuit provides a propagation-out hit signal to a downstream CAM chip, in response to the self-timed signal, the hit signal and the propagation-in hit signal from the upstream CAM chip, so that a hit signal is propagated from an upstream CAM chip to a downstream CAM chip. Each CAM chip may include an extra row for providing a modelmiss signal or a modelhit signal which is used for a generating self-timed signal. Each word may be divided into two halves and two match lines of the two halves are coupled by a logic circuit. The system may also observe a multiple match status and the highest priority chip indicating a match.

11 Claims, 9 Drawing Sheets

CONTENT ADDRESSABLE MEMORY SYSTEM WITH CASCADED MEMORIES AND SELF TIMED SIGNALS

This application is a continuation of application Ser. No. 08/919,227, filed Aug. 28, 1997, now U.S. Pat. No. 6,230, 236.

TECHNICAL FIELD

The present invention relates to a content addressable memory (CAM) system in which a plurality of CAM chips are cascade-connected.

BACKGROUND INFORMATION

In known CAMs, data is selected based on contents, rather than physical location. This function is useful for many applications, especially when performing a look-up for the purposes of mapping a long identification word data to a shorter word data. This operation is required in many telecommunications (telecom) functions, including Asynchronous Transfer Mode (ATM) address translation.

Often, system storage requirements exceed the number of entries stored on a single CAM chip. Multiple chips are then required, and it is necessary that a means be developed to cascade these multiple chips such that they may be searched as a single entity. An appropriate "user-friendly" cascading capability enables the same chip to be used in a range of systems with different capacity requirements, and allows for easy expandability and scalability, as well.

U.S. Pat. No. 5,568,416 granted to K. Kawana et al on Oct. 22, 1996 discloses an associative memory in which multiple CAM chips are cascaded by propagating a result address and status through all chips in the cascade. Each chip contains a status register for itself, and another for all upstream chips. It also discloses means of identifying the last device in the cascade, and separate storage areas for common and unique data entries.

SUMMARY OF THE INVENTION

It is an object of the present invention to provide an improved content addressable memory system.

According to one aspect of the present invention, there is provided a system comprising a common bus and a plurality of content addressable memory (CAM) chips which are cascaded and connected to the common bus, each of the CAM chips comprising a CAM array, timing signal means, hit propagation means and match address transfer means. In the system, each CAM array includes encoding means and an array of core cells, of w words×b bits, associated with the encoding means, each of the core cells comprising data storage means, the core cells of each word being associated with a respective match line. The CAM array of each CAM chip is able to provide, through its encoding means, hit and match address signals resulting from a search operation on that CAM chip in response to a clock signal. The timing signal means generates a self-timed signal in response to the clock signal. The hit propagation means provides a propagation-out hit signal to a downstream CAM chip in response to the self-timed signal. The match address transfer means for transferring the match address signal resulting from the search operation on that CAM chip to the common bus in response to the self-timed signal.

For example, the hit propagation means of each of the CAM chips comprises a first logic circuit for responding to the self-timed signal provided from the timing signal means of that CAM chip, the hit signal provided from the CAM array of that CAM chip and the propagation-in hit signal provided from the upstream CAM chip. The match address transfer means of each of the CAM chips comprises a second logic circuit for responding to the self-timed signal provided from the timing signal means of that CAM chip, the hit signal provided from the CAM array of that CAM chip and the propagation-in hit signal provided from the upstream CAM chip. The second logic circuit comprises gate means for preventing more than one CAM chip from transferring the match address signals from the CAM arrays of the CAM chips to the common bus simultaneously.

In another example of the system, the CAM array of each of the CAM chips further comprises an extra row for providing a modelmiss signal, the extra row being associated with the encoding means of that CAM array, the extra row including a model match line and a plurality of modified core cells connected to the model match line, the self-timed signal being provided in response to the modelmiss signal provided from that extra row and the clock signal. For example, one of the modified core cells is a mismatch cell and the others are match cells. The mismatch core cell is the farthest placed from the encoding means of that CAM chip.

In another example of the system, the CAM array of each of the CAM chips further comprises an extra row for providing a modelhit signal, the extra row being associated with the encoding means of that CAM array, the extra row including a chain of divided model match lines, each of the divided model match line being associated with a plurality of match core cells, two adjacent divided model match lines being coupled by a logic circuit for providing a logic output to the encoding means of that CAM array, the logic output being the modelhit signal.

In another example of the system, each of the w words is divided into two word divisions, each word division being one of two halves of each word, the two divided match lines of the two halves being coupled by a logic gate circuit for providing an output to the encoding means of that CAM array. The logic gate circuit may include a NAND circuit.

In another example of the system, each of the w words is divided into a plurality of word slices, that CAM array further comprising data means for providing each of the word slices with reference data for a search operation on that CAM chip.

In the system, each word slice of each word may be further divided into a plurality of word divisions, the core cells of each word division being associated with a divided match line of that word, two adjacent divided match lines of two word divisions of each word slice being coupled by a logic circuit for providing a logic output to the encoding means of that CAM array.

BRIEF DESCRIPTION OF THE DRAWINGS

An embodiment of the present invention will now be described by way of example with reference to the accompanying drawings in which.

DETAILED DESCRIPTION

It is desirable to implement a multi-chip CAM that has the same simple three result outputs as a single-chip CAM (i.e., hit, match address and multiple match). It is further desirable to allow simple expandability from a one-chip to n-chip system, using nothing but a plurality n of instances of the same chip.

I. Concept Of A CAM Array

Figure 1A:
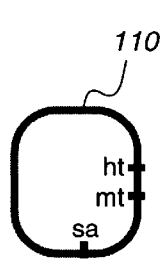
FIG. 1A illustrates conceptual view of a single CAM array and its output signals.
Figure 1B:
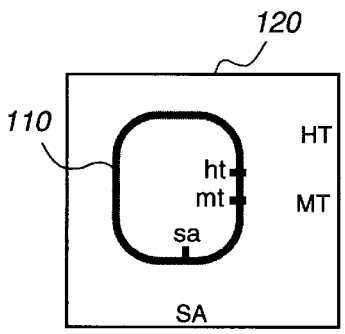
FIG. 1B illustrates the implied location of the CAM array within a single CAM chip.
Figure 1C:
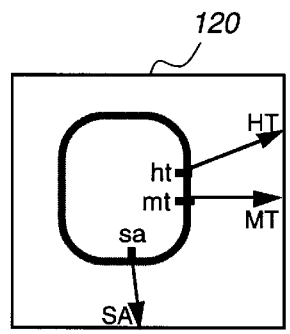
FIG. 1C illustrates the simplest possible connection of the CAM array to chip pins.

FIG. 1A conceptually represents a single CAM array. A CAM array 110 has three outputs: i.e., hit ht, multiple match mt and match address sa. Array outputs, as well as other on-chip signals are denoted in this disclosure by lower-case lettering. Signals which travel on and off chip (via pins) are denoted by upper-case lettering. Hereinafter, whenever a CAM chip is shown, by implication the array is embedded on a CAM chip 120 as shown in FIG. 1B. The simplest possible connections between the array outputs and the chip outputs are shown in FIG. 1C.

II. An Efficient Manner Of The Connection Of Multiple CAM Chips

It is the intent of this invention to enable the connection of a plurality of CAM chips in an efficient manner.

To achieve cascadability with simple expandability, the following are requirements for chip design:

(1) The multiple chips should be able to share as many control signals and buses as possible, to avoid the need for new board-level signals for each additional chip.

(2) In order for the combination of multiple chips to appear as a single entity, the over-all search result should be available at some pre-determined location in a system in which a plurality of CAM chips are cascaded. This applies to an encoded match address, a hit indication, and a multiple match indication, if one is provided. If this capability (of providing the result at a pre-determined location) is provided, it will not be required to sequentially poll the multiple chips to determine the search result.

(3) All chips in the cascade are required as identical, in terms of:
  (a) actual physical composition;
  (b) programmed capability, specifically "priority". Chip's priority should be inherently defined by its position in the cascade, and should not require programming of an on-chip register.

(4) The number of signals driven from chip-to-chip in a cascaded fashion should be minimized:
  (a) The encoded match address is too wide to propagate in this fashion.
  (b) The chip-to-chip "daisy-chain" signals should ideally have some meaning to the user, in addition to their utility in chip-to-chip signalling.

(5) It is clear from the above design- requirements that all of the chips in the cascade will be capable of driving their individual match address results onto a single bus:
  (a) There should be no contention problems on this bus.
  (b) On-chip circuitry should determine which chip is to drive the bus; it is not required to have means for selecting a chip for enabling.

III. Maximization Of The Number Of Shared Signals

To maximize the number of shared signals, it is proposed that all chips in the multi-chip cascaded CAM use:

(1) A common input data bus for write data.

(2) A common output data bus for read data.

(3) A common address bus for randomly addressable writes and reads.

(4) A common set of mode control signals, to determine which operation (write, read, or search) is being performed on the multi-chip CAM, as a whole.

(5) A common input bus for the search input (or "comparand").

(6) A common output bus for the search result, which is usually the encoded address of a match. Note that the "result" could also be a data item stored together with, and associated with, the comparand. It may also be a series of data items, either:
  (a) multiple encoded addresses, in the case of a multiple match search outcome
  (b) multiple items of associated data
  (c) a combination of the above Note that the buses (1), (2), and (5) above may easily have dual or triple uses.

The following deals with the search function of the multi-chip cascade CAM, as the sharing of buses and control signals for memory reads and writes is well understood and documented in the literature.

IV. Concept Of A Multi-Chip CAM System

The system hit and multiple match results are available at the downstream end (the low priority end).

The multiple match function need not necessarily be provided.

An encoded address is available on the shared result bus. It may comprise:

(a) The result, as determined by the particular chip enabled to drive the bus, and as described by the common output bus description (6) above.

(b) The result plus an encoded address uniquely identifying the selected chip.

This encoded address need not propagate through multiple chips.

All chips are identical (aside from any optional identification encoding capability implied above), and priority is determined by location in the cascade: the further upstream, or the further to the left, the higher the priority. A higher priority match disables a lower priority match from driving the result bus.

Figure 2:
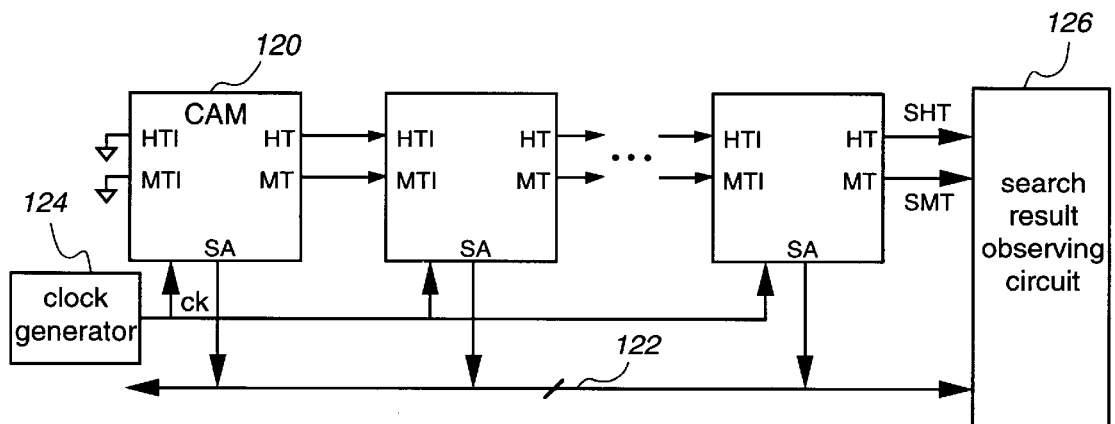
FIG. 2 is a block diagram of a system including a plurality of CAM chips which are cascaded, according to an embodiment of the present invention.

The connection of hit, multiple match, propagation-in hit, and propagation-in multiple match pins as shown in FIG. 2 implements a "daisy chain".

The observation of a given hit and multiple match pair will indicate the status of the entire system upstream (to the left) of that particular pair.

V. Embodiment Of A Multi-Chip CAM System

Referring to FIG. 2 which shows a system according to an embodiment of the present invention, the system includes n CAM chips 120 which are cascaded and each of the CAM chips 120 provides a match address signals SA to a common shared bus 122. Each of the CAM chips 120 has hit and multiple match input terminals for receiving the hit and multiple match signals (off-chip signals) HTI and MTI, respectively, from an upstream CAM chip 120 and hit and multiple match output terminals for providing the hit and multiple match signals HT and MT, respectively, to a downstream CAM chip 120. The hit and multiple match input terminals of the furthest upstream CAM chip 120 are connected to logic 0 terminals. Each of the CAM chip 120 has numerous variations which will be described later. The system hit and multiple match results SHT and SMT are available at the far right side (the furthest downstream CAM chip 120). A clock generator 124 provides clock signals ck to all of CAM chips 120. A search result observing or observation circuit 126 is connected to the bus 122 and the hit and multiple match output terminals of the furthest downstream CAM chip 120.

Because the hit and multiple match results HT and MT provide information on the status of all or a portion of the system, rather than the status of a single chip, another means must be provided for determining the status of a given chip. A useful piece of status information is the ordinal location of the chip that has driven its result onto the bus 122 (i.e., the highest-priority chip with a match). The binary representation of the ordinal of the chip may be determined, in one possible way, by logic circuitry shown in FIG. 3. This solution requires logic circuitry external to the CAM chips forming the cascade, using the hit signals as inputs.

Figure 3:
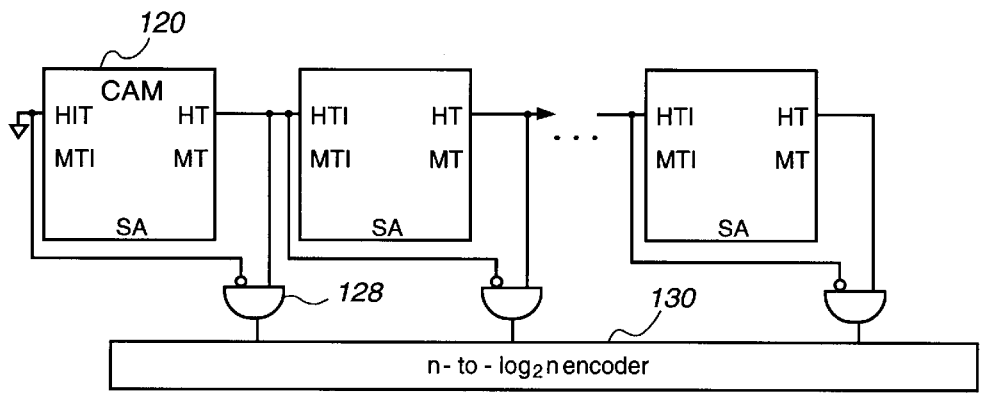
FIG. 3 illustrates the system with circuitry for determining a bus driving CAM chip.

FIG. 3 shows the cascaded CAM chips with external logic circuits including n AND gates for determining which CAM chip is driving the common bus. Referring to FIG. 3, each of the AND gates 128 has inverting and non-inverting input terminals. The hit input and output terminals of each of CAM chip 120 are connected to the inverting and non-inverting input terminals of the respective AND gate 128. The n output signals from the AND gates 128 are fed to an n-to-log$_2$n encoder 130.

Alternatively, the AND gates 128 may be integrated on-chip, with an additional pin on the CAM chip 120 provided to indicate whether the particular chip has the highest-priority hit, and is driving the bus 122. Also, search address results may be stored on-chip in registers (not shown). The output of the encoder 130 may be used to determine which chip's result register is read.

Above, it was stated in design requirement (5) that on-chip circuitry has to ensure that there is no contention on the common bus; i.e., more than one chip is never attempting to drive the bus 122 at one time. In order to implement this functionality on-chip, an internal self-timed signal st is introduced. This signal goes low following the rising edge of the clock signal ck which initiates the search operation. It rises after valid data is present on the internal address bus, and on the internal hit signal ht. Hence, transitions on the self-timed signal st can be made to model those on the hit signal ht. Timing of these transitions is shown in FIG. 4.

Figure 4:
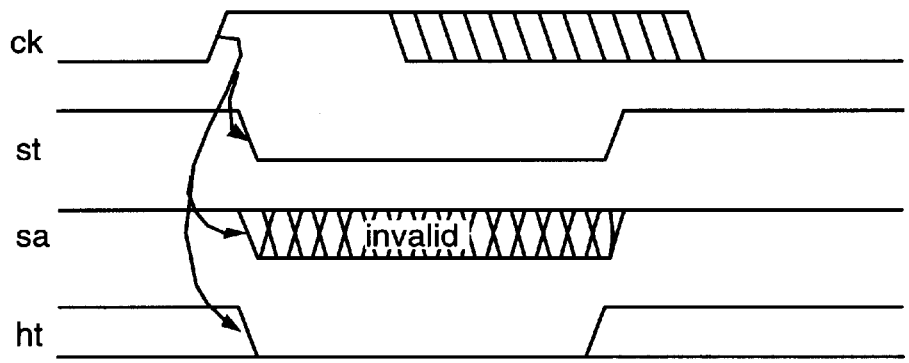
FIG. 4 is a timing chart showing self-timed signal and on-chip search results.

Given the signals shown in FIG. 4, a system hit status is propagated and it is ensured that only a single chip drives the shared result bus. This is accomplished with the logic shown in FIG. 5 which shows how inter-chip signals are generated.

Figure 5:
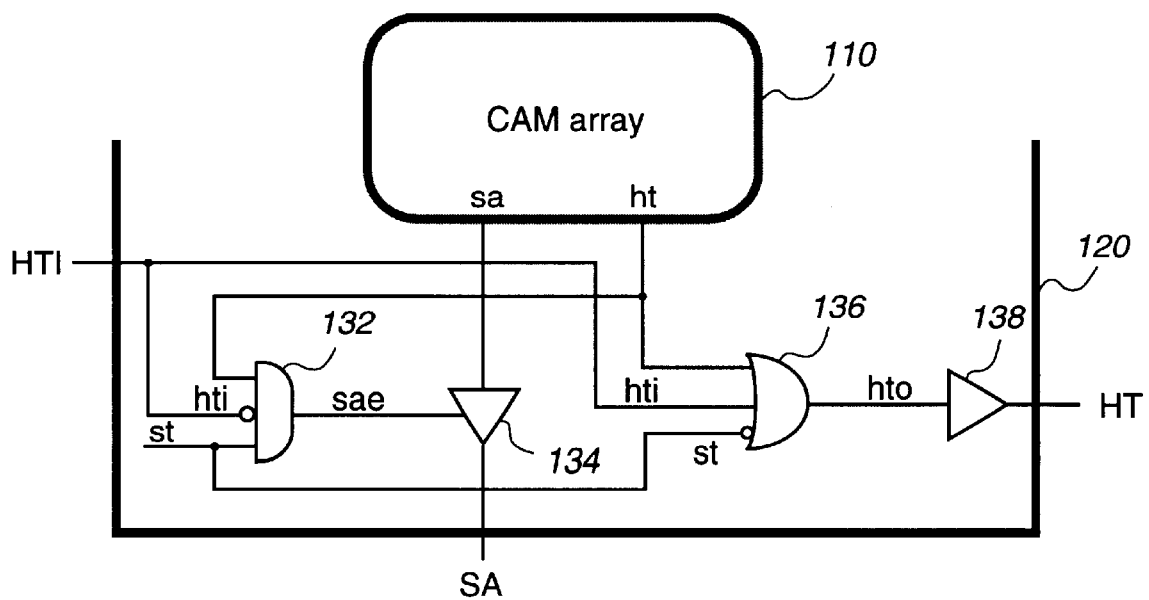
FIG. 5 illustrates logic gates for cascading the CAM array.
Figure 6A:
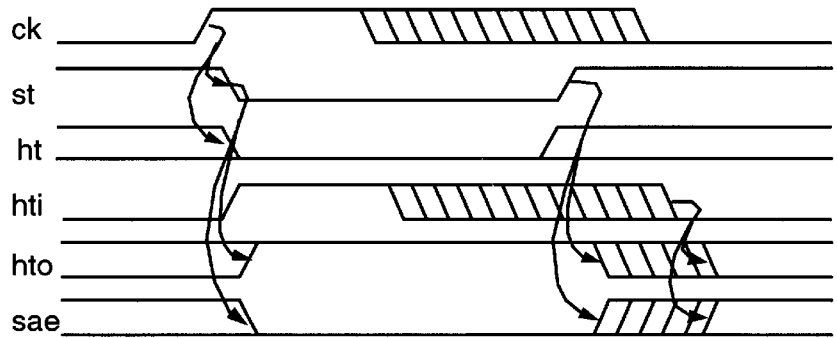
FIG. 6A is a timing chart showing relative timing of on-chip signals responsive to the 0-1-0 transition of a propagation-in hit signal.
Figure 6B:
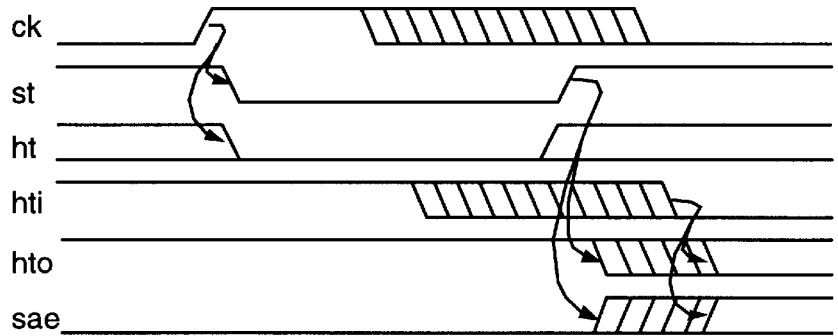
FIG. 6B is a timing chart showing relative timing of on-chip signals responsive to the transition from 1 to 0 of the propagation-in hit signal.
Figure 6C:
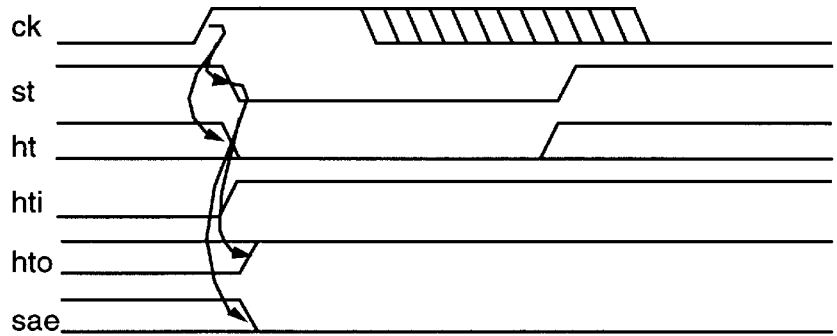
FIG. 6C is a timing chart showing relative timing of on-chip signals responsive to the transition from 0 to 1 of the propagation-in hit signal.
Figure 6D:
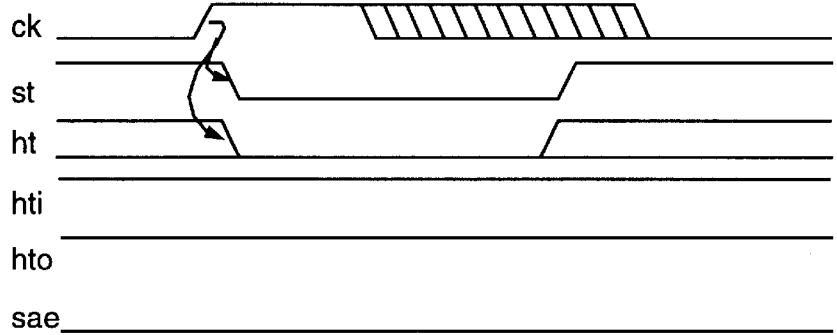
FIG. 6D is a timing chart showing relative timing of on-chip signals responsive to the 1 logic level of the propagation-in hit signal.

FIG. 5 shows a CAM array with logic circuits for generating inter-chip signals. Referring to FIG. 5, the CAM chip 120 contains a CAM array 110, an AND gate 132 with one inverting input, a transfer gate 134, an OR gate 136 with one inverting input and a buffer 138. A propagation-in hit signal hti from an off-chip signal HTI is fed to the inverting input terminal of the AND gate 132 and the OR gate 136. An internal self-timed signal st is provided to the AND gate 132 and the inverting input terminal of the OR gate 136. A hit signal ht from the CAM array 110 is fed to the AND gate 132 and the OR gate 136. A match address enable signal sae is fed from the AND gate 132 to the transfer gate 134. A match address signal sa from the CAM array 110 is fed to the transfer gate 134, which prevents the match address signal from passing through the gate when the enable signal sae is low. An off-chip address signal SA is provided by the transfer gate 134. A propagation-out hit signal hto from the OR gate 136 is fed to the buffer 138 which in turn provides an off-chip hit signal HT.

During the time interval when st=0 on all if the CAM chips 120 in the system, no chips are enabled to drive the bus 122. During the same interval, all hit signals HT in the cascade are at logic 1. Due to st=0, no address signal SA is provided regardless of the propagation-in hit signal hti. This partial redundancy may be removed by re-timing the signals and decreasing the number of inputs to the gates. Note that such an approach would lead to a less robust design.

Waveforms of all of the relevant signals on a single chip are shown in FIGS. 6A–6D, for the four different cases of the propagation-in hit signal hti (0-1-0 transition, 1-0 transition, 0-1 transition, and 1 logic level). Note that the propagation-in hit signal hti is the on-chip propagation of the off-chip signal HTI (see FIG. 5).

As can be seen, correct operation is independent of (a) speed differences between chips and (b) inter-chip routing delay, because de-selection occurs on-chip, and only selection is gated by upstream off-chip signals. This feature also supports expandability, as additional chips added to a system may be subject to different processing conditions, or even a completely different fabrication technology.

When worst-case timing is characterized, the slowest path to selection will be from the propagation-in hit signal HTI input. The downward transition on the propagation-in hit signal HTI may further propagate to the propagation-out hit signal HT (assuming ht=0), such that the worst-case system performance is equal to that of a single chip standing alone, plus (n−2) times the propagation-in hit signal HTI-to-HT delay plus the propagation-in hit signal HTI-to-SA delay. System performance can be characterized by the following expressions:

tCH-SAV=tCH-HTV+(n−2)×tHTIL-HTL+tHTIL-SAV tCH-SHTV=tCH-HTV+(n−1)×tHTIL-HTL

All timing parameters correspond to signals in FIGS. 2, 4 and 6A–D.

- tCH-SAV=time from upward transition on the clock signal ck to valid SA
- tCH-HTV=time from upward transition on the clock signal ck to HT valid for a single chip in isolation
- tHTIL-HTL=time from downward transition of HTI at a chip input to downward transition of HT at the same chip's output
- tHTIL-SAV=time from downward transition of HTI at a chip input to valid SA driven out from the same chip
- tCH-SHTV=time from an upward transition on the clock signal ck to valid SHT.

Note that, without the self-timed signal st, disabling and enabling SA drive would be dependent on HTI timing. Bus contention would be difficult to prevent, and disable timing would depend on a chip's position in the cascade.

Figure 7:
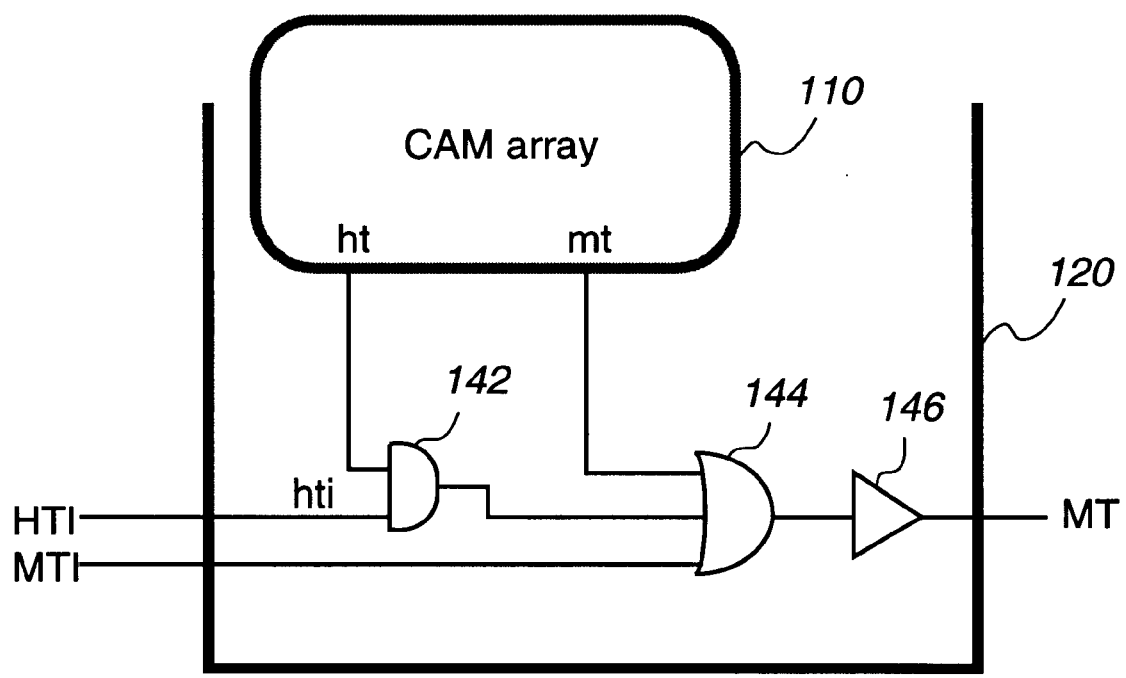
FIG. 7 illustrates logic gates to implement multiple match propagation in the system.

The multiple match signal MT, if present, must propagate in a similar way, with logic on each chip, in one example, shown in FIG. 7 which illustrates logic gates to implement MT propagation in a cascaded CAM. Referring to FIG. 7, the hit signal ht and the multiple match signal mt from the CAM array 110 are fed to an AND gate 142 and an OR gate 144, respectively. The propagation-in hit signal hti is fed to the AND gate 142, the output signal of which is fed to the OR gate 144. The multiple match signal mt is fed to the OR gate 144, the output signal of which is fed to a buffer 146. The off-chip multiple match signal MT is provided by the buffer 146.

VI. Generator Of A Self-Timed Signal

There are many possible circuits of self-timed signal generators which provide the self-timed signal st to the AND gate 132 of the CAM chip's logic circuit as shown in FIG. 5. It is the intended scope of this invention to subsume any such circuit, provided the resulting self-timed signal st is employed as described above to enable contention-free result bus sharing.

In the description that follows, disclosed are examples of self-timed signal generators. These examples are meant to provide a broad view of implementation possibilities, and their descriptions in no way limit the scope of the foregoing part of this patent disclosure.

Figure 8:
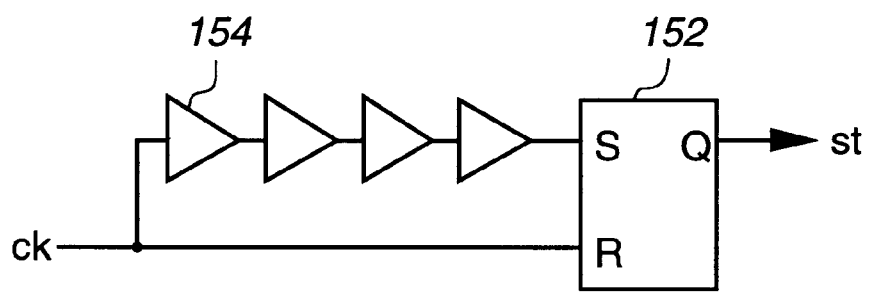
FIG. 8 is a block diagram of a self-timed signal generator.

In a first example of a self-timed signal generator, shown in FIG. 8, a simple delay line models the expected delay in the generation of a hit signal. Referring to FIG. 8, the clock signal ck is fed to a reset input terminal R of a flip-flop 152. Also, the clock signal ck is fed to a set input terminal S of the flip-flop 152 through a chain of four buffers 154.

The falling edge of the self-timed signal st is generated by the rising edge of the clock signal ck, while the rising edge of the self-timed signal st is generated by a delayed version of the rising edge of the clock signal ck. The S/R (set/reset) latch shown in this and subsequent figures represents a logical function, and not necessarily a physical realization. Timing both edges of the self-timed signal st from the rising edge of the clock signal ck results in duty cycle independence. The delay of the delay chain can be set equivalent to the delay between the rising edges of the clock signal ck and the hit signal ht. Alternatively, if the duty cycle of the clock signal is known and well controlled, timing of the rising edge of the self-timed signal st may be controlled by the falling edge of the clock signal ck. Note that hit timing must be predictable, in order to employ this example; it is not appropriate in a modular or scalable design, in which the hit signal delay may vary from implementation to implementation.

VII. Examples Of CAM Arrays

VII-1. First Example

Figure 9:
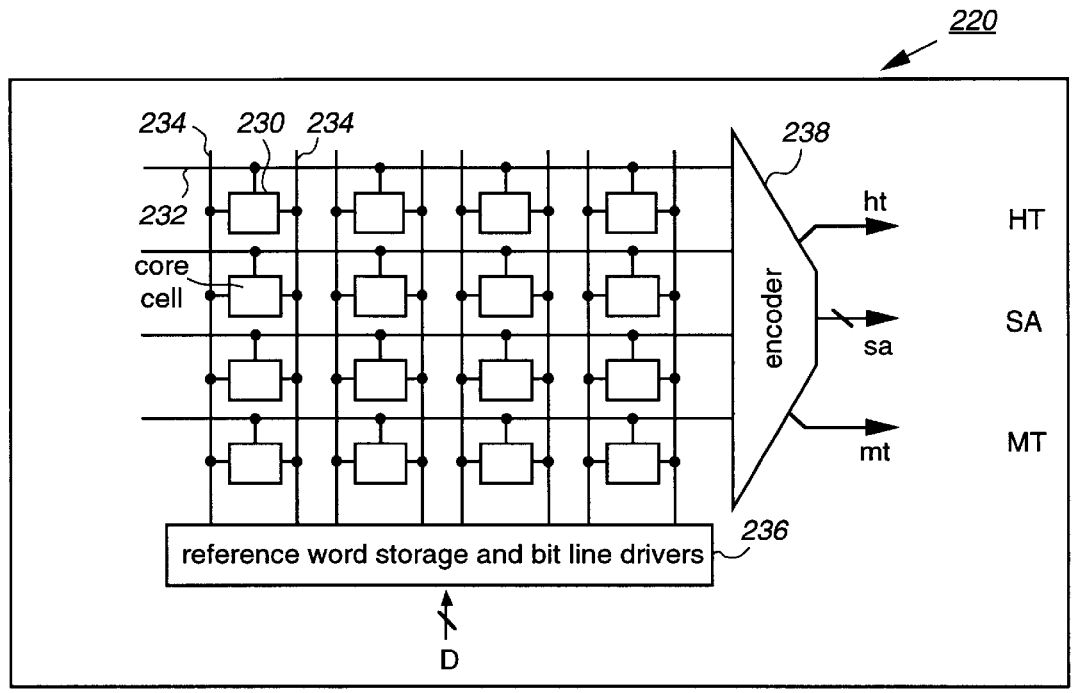
FIG. 9 is a circuit diagram of a first example of a CAM chip.

FIG. 9 shows a first example of the CAM array which is implemented in a CAM chip 220. In the CAM array, a single chip CAM of w (=4) words×b (=4) bits is implemented as an array with w rows and b columns. The CAM array includes w×b (=16) core cells 230, each cell being at the intersection of a match line 232 and a pair of bit lines 234. A pair of bit lines 234 carry differential data representing a single bit, rather than two bits of data. Each of the core cells 230 acts to store a single bit of data and is capable of performing a singlebit comparison (logical exclusive NOR (XNOR)) operation, in addition to its bit storage capability. In FIG. 9, the cells 230 belonging to a given word are connected to the match line of that word in a logical NOR fashion. The structure of the CAM array is known. See a paper by K.J. Schultz et al. entitled "Architectures for Large-Capacity CAMs", INTEGRATION: the VLSI Journal, Vol. 18, pp. 151–171, 1995, which is incorporated herein by reference.

All of the paers of bit lines are connected to reference word storage and bit line drivers 236 which receive input data D for loading the contents of the CAM array and for a search reference word. Data stored in the array's core cells 230 are searched by applying a reference word on the bit lines 234.

When differential data is asserted on a pair of bit lines 234 in a search operation, the core cell 230 compares its stored data bit with this differential data (also known as reference data, or a single bit of the comparand). When the stored data is not equal to the reference data, the core cell 230 pulls the match line 232 (which is precharged to a logical high state) down to a low state. When the stored data is equal to the reference data, the cell 230 has no effect on the match line 232 to which it is connected. Because all of the core cells 230 in a given word are connected to the match line 232 in the same way, the match line 232 will be pulled low if any bit in its word is unequal to (or mismatches) the corresponding reference bit. The match line 232 remains in a logical high state only if all bits in its word match their corresponding reference bits.

The CAM array includes an encoder 238 which is connected to the match lines 234. The encoder 238 produces three outputs that represent the result of the search operation. A "ht" signal is asserted to a logical high state if any of the w words is storing data which has matched the reference data. The binary address of this matching word is encoded onto an "sa" output. In the event that a plurality of words have matched the reference data, a multiple match signal "mt" is asserted to a logical high state. In this event, the address sa output of the encoder 238 may produce (a) an invalid result, (b) an address representing the location of a single one of the multiple matches, or (c) a sequence of outputs, representing the locations of each of the matched words. Note that some applications may not require the multiple match result, and all references to the multiple match function may be eliminated from this disclosure, without loss of utility.

VII-2. Second Example

Figure 10:
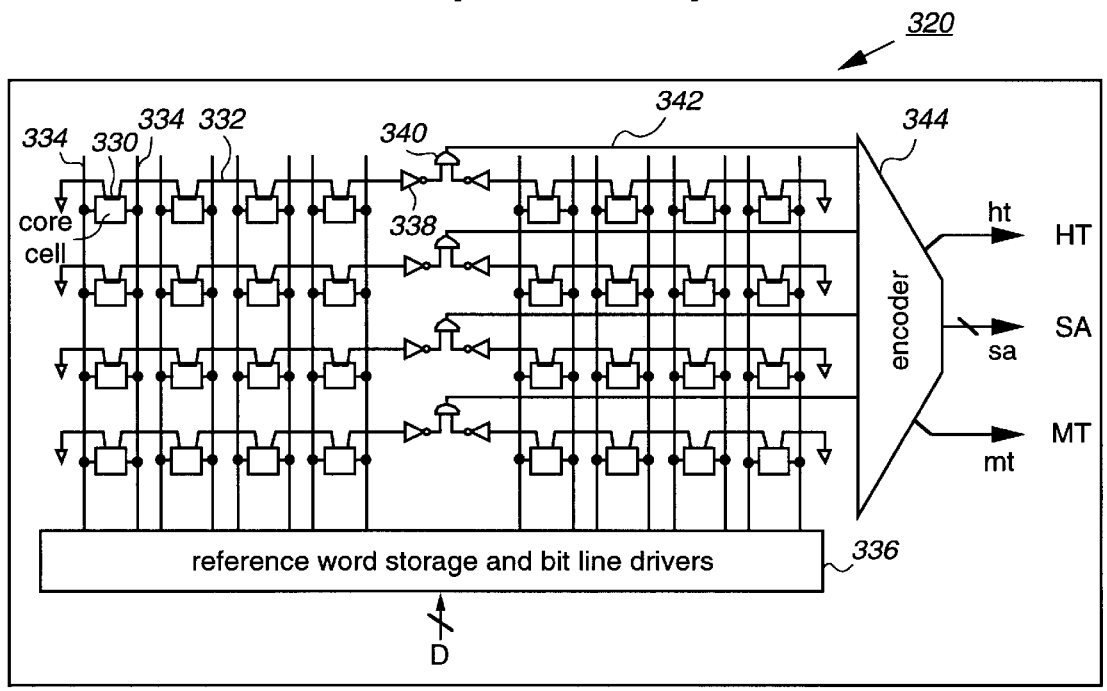
FIG. 10 is a circuit diagram of a second example of a CAM chip.

FIG. 10 shows a second example of the CAM array which is implemented in a CAM chip 320. In the CAM array, the words are divided into two halves, and the results of the match on each half word are combined. Each of the two halves is provided with an array of 4 rows×4 columns. The array includes 16 core cells 330, in each half each being at the intersection of a match line 332 and a pair of bit lines 334 which carry differential data representing a single bit. Bit lines 334 for differential data are connected to reference word storage and bit line drivers 336 which receive input data D for loading the contents of the CAM array and for a search reference word. Data stored in the array's core cells 330 are searched by applying the reference word on the bit lines 334.

Each of the core cells 330 acts to store a single bit of data and is capable of performing a single-bit comparison (logical exclusive NOR (XNOR)) operation, in addition to its bit storage capability. In FIG. 9, the cells 330 belonging to a given word are connected to the match line of that word in a logical NAND fashion. The core cells 330 of each word are chained in the respective match line 332. The match line 332 of each half word is connected via an inverter 338 to an AND gate 320, the output terminal of which is connected via a multiple match line 342 to an encoder 344.

In FIG. 10, the connection of the cells (in each half word) to the match line is in a logical NAND. The match line 332 will only have a downward transition if all of the bits in the half word are equal to the reference data. Hence, the path to ground for the match line 332 is serial (a "match line chain") rather than parallel, and the path is made conductive (i.e., the circuit is closed) in the event of a match, rather than a mismatch.

The advantage of this technique is due to the much smaller number of match lines 332 subject to a in each search operation: one per match in the example shown in FIG. 10, compared to one per mismatch in the prior art circuit shown in FIG. 10. This reduces power dissipation considerably, allowing the realization of larger storage capacities. The division of the word into halves decreases the length of the NAND chain, thus increasing speed.

The CAM array shown in FIG. 10 may place multiple words in a physical row, by employing an upper metal layer above the core cell for the multiple match lines 342. This further increases the storage capacity that can be realized.

The CAM array produces three outputs ht, sa and mt that represent the result of the search operation, and these may all be generated by the encoder 344. The "ht" signal is asserted to a logical high state if any of the w words is storing data which has matched the reference data. The binary address of this matching word is encoded onto the "sa" output. In the event that a plurality of words have matched the reference data, the multiple match signal "lmt" is asserted to a logical high state. In this event, the address (sa) output of the encoder may produce (a) an invalid result, (b) an address representing the location of a single one of the multiple matches, or (c) a sequence of outputs, representing the locations of each of the matched words.

Note that there are many other possible CAM arrays, and the invention herein described may be used to add cascadability to any of these examples.

The basic function of a single CAM array does not change from that of the examples described above, in the case when a plurality of arrays (on a plurality of chips) are cascaded together to realize a capacity larger than that which may be realized by a single array on a single chip.

VII-3. Third Example

Figure 11:
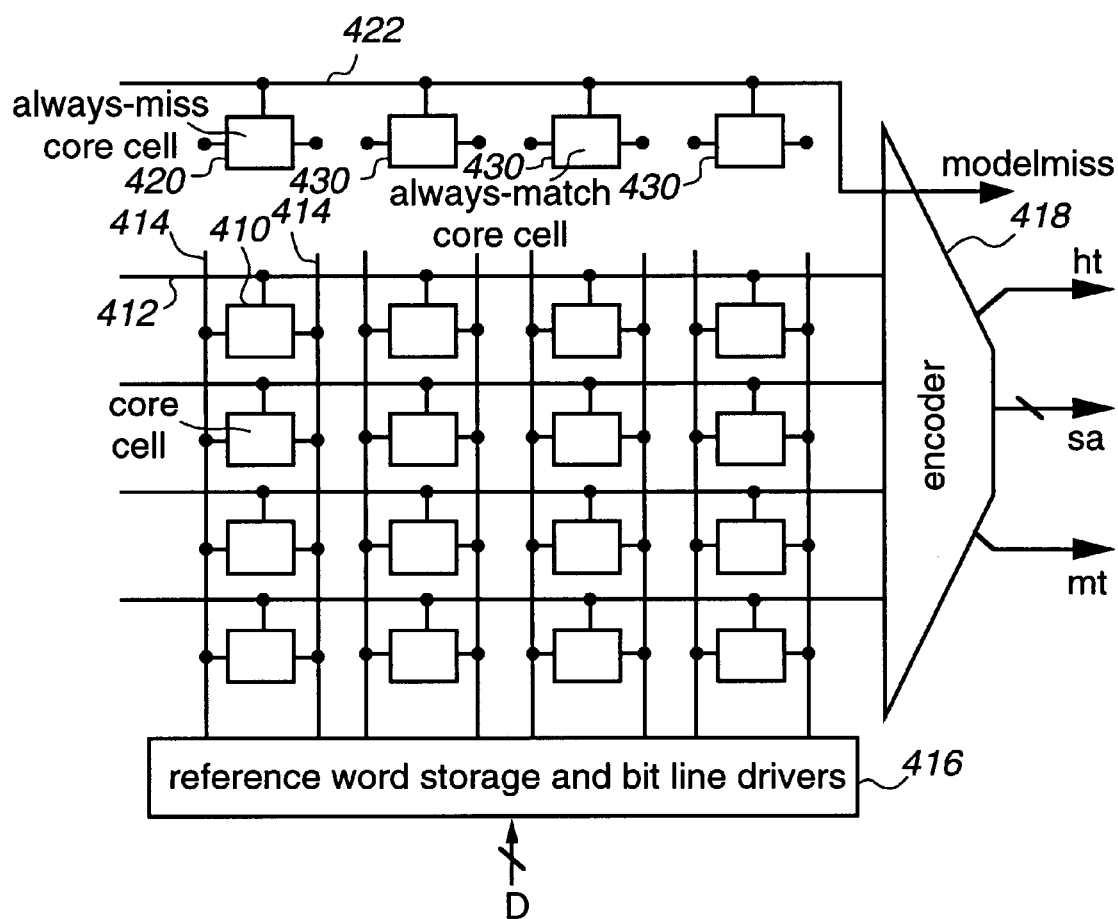
FIG. 11 is a circuit diagram of a third example of a CAM chip.
Figure 12:
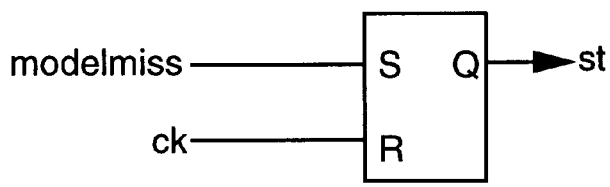
FIG. 12 illustrates a self-timed signal generator.

FIG. 11 shows a third example of the CAM array. It produces a "modelmiss" signal which tracks variable hit signal delay, and is an extension of the first CAM array described above (and shown in FIG. 9). FIG. 12 shows an accompanying self-timed signal generator which provides a self timed signals to logic gates of the CAM chip (e.g., the AND gate 132 shown in FIG. 5).

The falling edge of the self-timed signal st is initiated by the rising edge of the clock signal ck (directly or indirectly), and the rising edge of the self-timed signal st is initiated by the modelmiss signal. An extra row is provided in the CAM array for the purpose of generating timing information. The core cells along this row are modifications of a standard core cell 410 (identical to the core cell 230 in FIG. 9). An always-miss core cell 420 is placed at the end of a model match line 422 farthest from an encoder 418, while the rest of the row is populated with always-match core cells 430. The slowest possible (single-word) search result in a standard NOR match line implementation is a single-bit miss, and it is modelled by this arrangement. The downward transition on the modelmiss signal corresponds with the instance at which valid data is guaranteed on the hit signal ht. Note that, in order to generate the hit signal polarities shown in previous timing diagrams, the hit signal should also initially be driven low in a preconditioning transition immediately following the rising edge of the clock signal ck.

VII-4. Fourth Example

Figure 13:
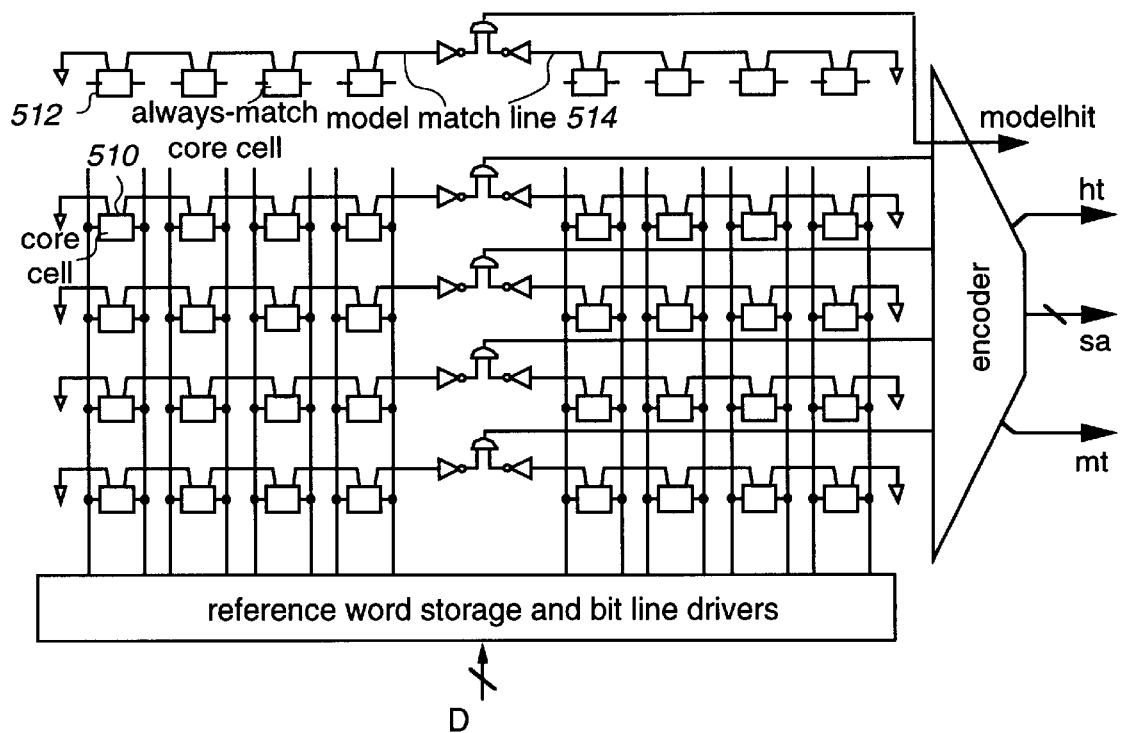
FIG. 13 is a circuit diagram of a fourth example of a CAM chip.
Figure 14A:
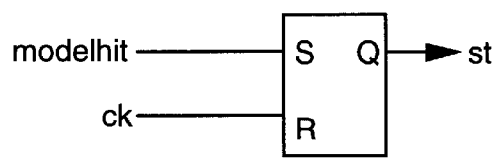
FIG. 14A illustrates a self-timed signal generator.
Figure 14B:
FIG. 14B illustrates a self-timed signal generator.

A fourth example includes circuitry to track hit delay in a CAM array implemented according to the second CAM array described above (and shown in FIG. 10). This is shown in FIG. 13. Accompanying self-timed signal generators are shown in FIGS. 14A and 14B. The falling edge of the self-timed signal st is initiated by the rising edge of the clock signal ck (directly or indirectly), and the rising edge of the self-timed signal st is initiated by a modelhit signal. An extra row is provided in the CAM array for the purpose of generating timing information. The core cells along this row are modifications of a standard core cell 510 (identical to the core cell 330 in FIG. 10). An always-match core cell 512 is used throughout model match line chains 514. The slowest possible (single-word) search result in this NAND match line implementation is a match, and it is modelled by this arrangement. The upward transition on the modelhit signal corresponds to the instance at which valid data is guaranteed on the hit signal ht. Note that, in order to generate the hit signal polarities shown in the previous timing diagrams, the hit signal should also initially be driven low in a preconditioning transition immediately following the rising edge of the clock signal ck. Because modelhit has the same polarity as the self-timed signal st, the self-timed signal drive circuit may be removed, and modelhit may be used as the self-timed signal st, as shown in FIG. 14B. The self-timed signal st is fed to the AND gate 132 of the CAM chip's logic circuit as shown in FIG. 5.

VII-5. Fifth Example

Figure 15:
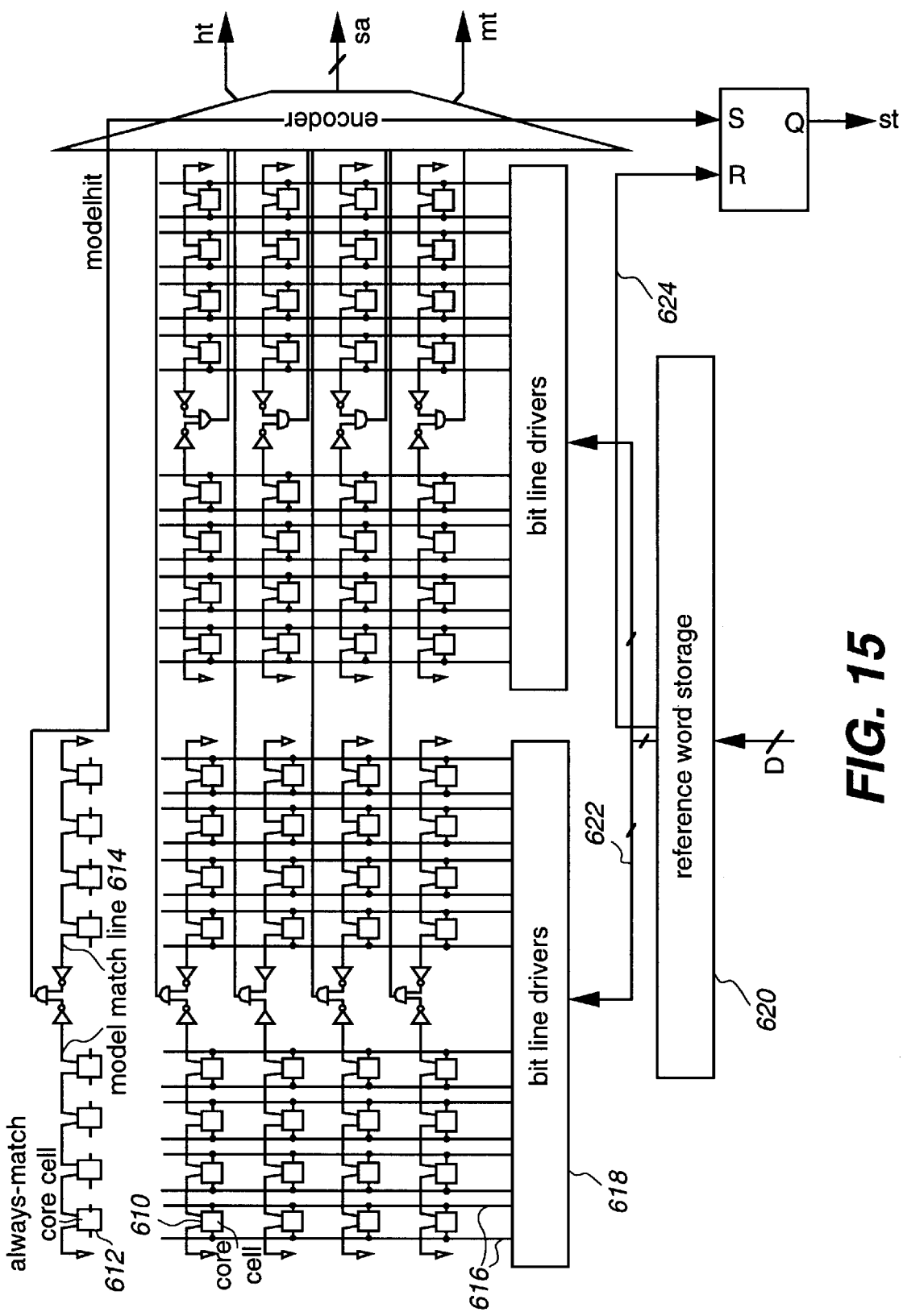
FIG. 15 is a block diagram of a fifth example of a CAM chip.

FIG. 15 is a block diagram of a circuit using a plurality of word slices using the same match logic as the second CAM array where a self-timed signal generation in this arrangement employs a model global data line.

A fifth example of the self-timed signal generator can be used to track hit delay in a CAM array with a plurality of the vertical word slices employed in the second CAM array, as shown in FIG. 15. The plurality of word slices allows the realization of larger capacities. Because all bits of the comparand D must be bused to all word slices, a global data bus 622 is employed. Timing information may be embedded in a global data bus 622, in the form of a model global data line 624. The model global data line 624 is driven such that its first transition approximately coincides with the downward transition of the hit signal ht. The model global data line 624 is also used to provide timing information to the CAM array, guaranteeing this coincidence. The falling edge of the self-timed signal st is initiated by the first transition of the model data, and the rising edge of the self-timed signal st is initiated by the modelhit signal. An extra row is provided in the word slice of the CAM array farthest from an encoder, for the purpose of generating timing information. The core cells along this row are modifications of a standard core cell 610 (identical to the core cell 330 in FIG. 10). An always-match core cell 612 is used throughout model match line chains 614. The slowest possible (single-word) search result in this NAND match line implementation is a match, and it is modelled by this arrangement. The upward transition on the modelhit signal corresponds with the instance at which valid data is guaranteed on the hit signal ht. Note that, in order to generate the hit signal polarities shown in the previous timing diagrams, the hit signal ht should also initially be driven low in a preconditioning transition following the rising edge of the clock signal ck, with its timing governed by the model global data on the line 624. As in the previous two examples, delay of the modelhit signal through the encoder is meant to track that of the hit signal ht through the encoder. Where the encoder is realized with random logic, this may be achieved by a delay chain. Where the encoder is realized as a read-only memory (ROM), delay matching may be achieved with a model ROM bit line.

Note that a NOR match line CAM array may also be implemented in a word slice fashion to achieve higher capacities. The self-timed signal may be generated by combining the signal on the model match line shown in FIG. 11 with the model global data on the line 624 shown in FIG. 15.

Figure 16:
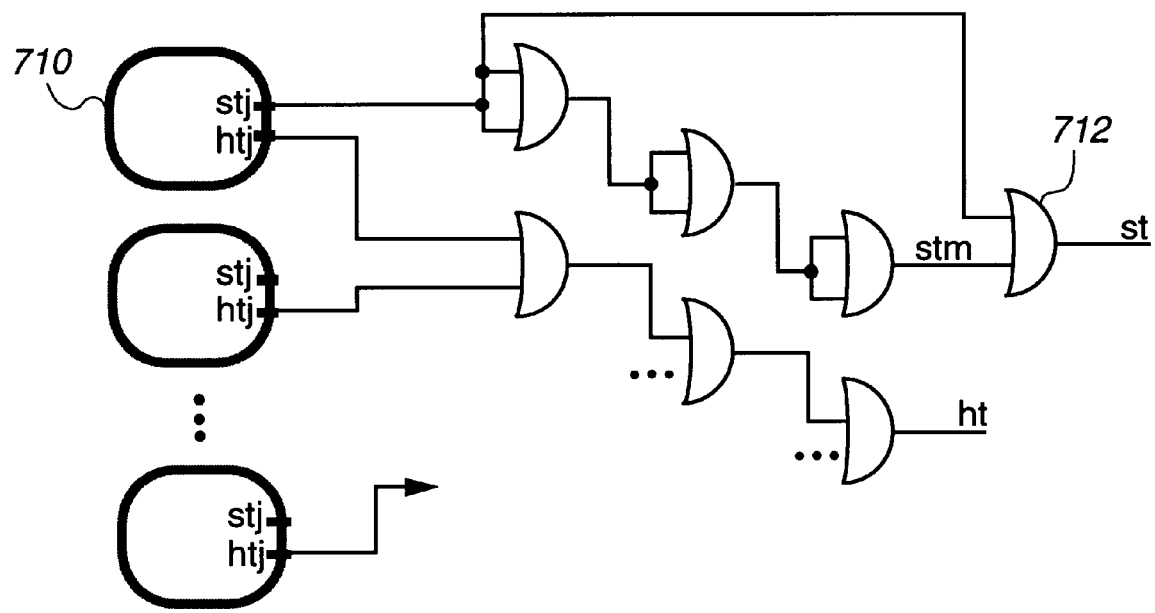
FIG. 16 illustrates logic gates to implement appropriate full-chip timing of a self-timed signal to multiple CAM arrays.

FIG. 16 illustrates logic gates to implement appropriate full-chip timing of the self-timed signal st, in the case when a CAM chip comprises multiple CAM arrays.

When the CAM on each chip is composed of multiple arrays, each CAM array 710 has its own "htj" and "stj" signals, and it is necessary to widen the duration of the pulse of the self-timed signal st, to allow for the delay in combining individual signals into the hit signal ht. FIG. 16 shows an example of this pulse-widening, in which a single stj signal is logically ORed by OR gate 712 with a delayed version of the same stj (referred to as "stm"), the stj signal having passed through a delay similar to that of the array hit signal htj to ht.

Figure 17:
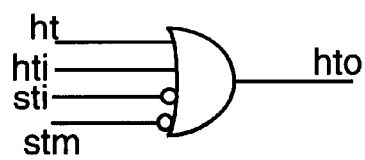
FIG. 17 illustrates a logic gate to generate a propagation-out hit signal.

Another example, shown in FIG. 17, brings both stm and stj to the propagation-out hit signal hto gate (see FIG. 5). Both examples of FIGS. 16 and 17 prevent a downward glitch on the propagation-out hit signal hto when the propagation-in hit signal hti=0 and hit makes an upward transition following stj. This same sequence of transitions is not consequential to the sae gate of FIG. 5, and no changes to it, similar to FIG. 17, are required.

The CAM array is not limited to ones shown in FIGS. 9, 10, 11, 13 and 15. There are many variations. For example, in one variation, the data comparison function of a CAM array is not performed by the core cells, but is performed by separate comparators placed adjacent to the core cells. Such a CAM array is described in U.S. patent application Ser. No. 08/748,928 entitled "Large-Capacity Content Addressable Memory", filed on Nov. 14, 1996 by K. J. Schultz et al, now U.S. Pat. 5,828,593 which is incorporated herein by reference.

In the system in which a plurality of CAM chips are cascaded according to the embodiment of the present invention, status registers, address result propagation, last-device identification, or storage of common entries are not employed.

It is understood that there are many possible variations in embodiment detail that are logically subsumed by this invention disclosure, including different signal polarities, equivalent Boolean gate-level implementations, small timing variations, and so on.

What is claimed is:

1. A system comprising a common bus and a plurality of content addressable memory (CAM) chips which are cascaded and connected to the common bus, each of the CAM chips comprising:

a CAM array including:
(i) encoding means; and
(ii) an array of core cells, of w words×b bits, associated with the encoding means, each of the core cells comprising data storage means, the core cells of each word being associated with a respective match line, the CAM array of each of the CAM chips being able to provide, through that encoding means, hit and match address signals resulting from a search operation on that CAM chip in response to a clock signal;

timing signal means for generating a self-timed signal in response to the clock signal;

hit propagation means for providing a propagation-out hit signal to a downstream CAM chip in response to the self-timed signal; and match address transfer means for transferring the match address signal resulting from the search operation on that CAM chip to the common bus in response to the self-timed signal, wherein the hit propagation means of each of the CAM chips comprises a first logic circuit for responding to the self-timed signal provided from the timing signal means of that CAM chip, the hit signal provided from the CAM array of that CAM chip and a propagation-in hit signal provided from an upstream CAM chip.

2. The system of claim 1, wherein the first logic circuit of each of the CAM chips comprises an OR gate having inputs for receiving the hit signal from the CAM array of that CAM chip, an inverted signal of the self-timed signal provided from the timing signal means of that CAM chip and the propagation-in hit signal provided from the upstream CAM chip.

3. A system comprising a common bus and a plurality of content addressable memory (CAM) chips which are cascaded and connected to the common bus, each of the CAM chips comprising:

a CAM array including:
(iii) encoding means; and
(iv) an array of core cells, of w words×b bits, associated with the encoding means, each of the core cells comprising data storage means, the core cells of each word being associated with a respective match line, the CAM array of each of the CAM chips being able to provide, through that encoding means, hit and match address signals resulting from a search operation on that CAM chip in response to a clock signal;

timing signal means for generating a self-timed signal in response to the clock signal;

hit propagation means for providing a propagation-out hit signal to a downstream CAM chip in response to the self-timed signal; and match address transfer means for transferring the match address signal resulting from the search operation on that CAM chip to the common bus in response to the self-timed signal, wherein the match address transfer means of each of the CAM chips comprises a second logic circuit for responding to the self-timed signal provided from the timing signal means of that CAM chip, the hit signal provided from the CAM array of that CAM chip and the propagation-in hit signal provided from the upstream CAM chip.

4. The system of claim 3, wherein the second logic circuit of each of the CAM chips comprises gate means for preventing more than one CAM chip from transferring the match address signals from the CAM arrays of the CAM chips to the common bus simultaneously.

5. The system of claim 4, wherein the gate means of each of the CAM chips comprises a three-input AND gate having inputs for receiving the self-timed signal provided from the timing signal means of that CAM chip, the hit signal provided from the CAM array of that CAM chip and an inverted signal of the propagation-in hit signal provided from the upstream CAM chip.

6. A system comprising a common bus and a plurality of content addressable memory (CAM) chips which are cascaded and connected to the common bus, each of the CAM chips comprising:
   a CAM array including:
      (v) encoding means; and
      (vi) an array of core cells, of w words×b bits, associated with the encoding means, each of the core cells comprising data storage means, the core cells of each word being associated with a respective match line, the CAM array of each of the CAM chips being able to provide, through that encoding means, hit and match address signals resulting from a search operation on that CAM chip in response to a clock signal;
   timing signal means for generating a self-timed signal in response to the clock signal;
   hit propagation means for providing a propagation-out hit signal to a downstream CAM chip in response to the self-timed signal; and
   match address transfer means for transferring the match address signal resulting from the search operation on that CAM chip to the common bus in response to the self-timed signal,
   wherein:
      the CAM array of each of the CAM chips is further able to provide, through the encoding means of that CAM array, a multiple match signal resulting from the search operation on that CAM chip in response to the clock signal; and
      each of the CAM chips further comprises multiple match propagation means for providing a propagation-out multiple match signal to the downstream CAM chip, and wherein the multiple match propagation means of each of the CAM chips comprises a logic gate circuit for logically combining the hit signal provided from the CAM array of that CAM chip, the multiple match signal provided from the CAM array of that CAM chip, a propagation-in multiple match signal provided from an upstream CAM chip and a propagation-in hit signal provided from the upstream CAM chip.

7. A system comprising a common bus and a plurality of CAM chips which are cascaded and connected to the common bus, each of the CAM chips comprising:
   encoding means;
   an array of core cells, of w words×b bits, associated with the encoding means, each core cell comprising data storage means, each CAM chip comprising the array of core cells being operable to be searched in response to a clock signal and able to provide, through the encoding means of that CAM chip, hit and match address signals resulting from a search operation on that chip;
   timing signal means for generating a self-timed signal in response to the clock signal; and
   transfer means for transferring the match address signal provided through the encoding means of that CAM chip to the common bus in response to the self-timed signal provided from the timing signal means of that CAM chip, the hit signal provided through the encoding means of that CAM chip and a propagation-in hit signal provided from an upstream CAM chip, wherein the transfer means of each of the CAM chips comprises:
      AND gate means for providing an enable signal, the AND gate means combining the self-timed signal provided from the timing signal means of that CAM chip, the hit signal provided through the encoding means of that CAM chip and the propagation-in hit signal provided from the upstream CAM; and
      transfer gate means for transferring the match address signal provided through the encoding means of that CAM chip to the common bus in response to the enable signal provided from the AND gate means of that transfer means.

8. A system comprising a common bus and a plurality of CAM chips which are cascaded and connected to the common bus, each of the CAM chips comprising:
   encoding means;
   an array of core cells, of w words×b bits, associated with the encoding means, each core cell comprising data storage means, each CAM chip comprising the array of core cells being operable to be searched in response to a clock signal and able to provide, through the encoding means of that CAM chip, hit and match address signals resulting from a search operation on that chip;
   timing signal means for generating a self-timed signal in response to the clock signal; and
   transfer means for transferring the match address signal provided through the encoding means of that CAM chip to the common bus in response to the self-timed signal provided from the timing signal means of that CAM chip, the hit signal provided through the encoding means of that CAM chip and a propagation-in hit signal provided from an upstream CAM chip, wherein each of the CAM chips further comprises propagation means responsive to the self-timed signal provided from the timing signal means of that CAM chip, the hit signal provided through the encoding means of that CAM chip and a propagation-in hit signal provided from the upstream CAM chip to provide a propagation-out hit signal to a downstream CAM chip.

9. The system of claim 8, further comprising means for providing system hit and match address results of the cascaded CAM chips, in response to the propagationout hit signal provided from the furthest-downstream CAM chip and the match address signal provided from the common bus.

10. The system of claim 8, further comprising means for determining priority of chips in the cascaded CAM chips, in response to the propagation-in hit signals and the propagation-out hit signals provided from the cascaded CAM chips.

11. The system of claim 8, wherein the propagation means of each of the CAM chips comprises logic means for providing the propagation-out hit signal, the logic means logically combining the self-timed signal provided from the timing signal means of that CAM chip, the hit signal provided through the encoding means of that CAM chip and the propagation-in hit signal provided from the upstream CAM chip.

* * * * *